United States Patent [19]

Staffiere et al.

[11] Patent Number: 5,053,920
[45] Date of Patent: Oct. 1, 1991

[54] INTEGRATED POWER CONVERSION

[75] Inventors: Donald T. Staffiere, Wilmington; Harvey S. Friedman, Sudbury, both of Mass.

[73] Assignee: Digital Equipment Corporation, Maynard, Mass.

[21] Appl. No.: 595,656

[22] Filed: Oct. 9, 1990

Related U.S. Application Data

[63] Continuation of Ser. No. 363,706, Jun. 9, 1989, abandoned.

[51] Int. Cl.[5] .............................................. H05K 7/20
[52] U.S. Cl. ................................ 361/383; 174/35 R; 361/407; 361/424; 363/141
[58] Field of Search ................. 174/35 R, 70 B, 72 B, 174/16.3; 307/149, 150; 363/144, 141, 147; 361/382-384, 386-389, 392-394, 407, 424

[56] References Cited

U.S. PATENT DOCUMENTS

| | | | |
|---|---|---|---|
| 3,435,891 | 4/1969 | Parrish | 361/384 |
| 3,491,267 | 1/1970 | Goshorn | 361/407 |
| 3,895,285 | 7/1975 | Bardahl et al. | 363/141 |
| 4,538,073 | 8/1985 | Freige et al. . | |
| 4,622,627 | 11/1986 | Rodriquez et al. . | |
| 4,638,178 | 1/1987 | Kayser . | |
| 4,649,417 | 3/1987 | Burgess et al. . | |
| 4,695,872 | 9/1987 | Chatterjee . | |
| 4,719,541 | 1/1988 | Ono et al. | 361/407 |
| 4,742,385 | 5/1988 | Kohmoto . | |
| 4,809,153 | 2/1989 | Bremer et al. | 361/141 |

FOREIGN PATENT DOCUMENTS 1374666  11/1974  United Kingdom ............... 361/407

OTHER PUBLICATIONS

Adams et al, "High Current Carrying Modular Laminar Bus", IBM Technical Disclosure Bulletin, vol. 24, No. 2, 7/81, pp. 1239-1240.

Primary Examiner—Gregory D. Thompson
Attorney, Agent, or Firm—Kenyon & Kenyon

[57] ABSTRACT

A three-dimensional integrated power distribution and regulation apparatus for providing regulated power to a plurality of chips mounted on a module. The apparatus has a busbar mounted on the module, this busbar receiving high voltage power as an input. A plurality of power regulators are mounted on the busbar and are electrically coupled to this busbar. The power regulators are point-of-load regulators that receive high voltage power as an input and produce regulated power to the busbar. The busbar is electrically coupled to the chips and provides the chips with the regulated power. Heat and losses are reduced since the power regulators are mounted on the module, close to the chips themselves.

39 Claims, 4 Drawing Sheets

INTEGRATED POWER CONVERSION

This application is a continuation of application Ser. No. 363,706, filed June 6, 1989 now abandoned.

FIELD OF THE INVENTION

The present invention relates to the supplying and packaging of electrical power distributed to electronic devices on a module or circuit board. More particularly, the invention relates to the regulation and distribution of electrical power to electronic chips mounted on a module board, as well as to the integrated packaging of power components on the module.

BACKGROUND OF THE INVENTION

A circuit board or module of a computer typically will have many solid state electrical devices, such as chips, mounted on the module, all of which are designed to operate at fixed logic level voltages. In the proper operation of the circuit, these chips need to be supplied with power at the required logic level voltages, for example 3.3 volts or 5 volts. In addition, both the magnitude of these logic voltages and their device to device voltage differentials must be held within a tightly specified range.

The usual method for distributing power to the individual chips from a computer power supply is to regulate the power from, high voltages DC to the logic level voltages required by the chips, in a location remote from the module. The power is regulated from high-voltage and low current to low-voltage and high current. This low-voltage and high current power is then supplied from the remote location over a power bus to the module containing the plurality of chips. On the module, the power is then distributed to each of the individual chips on that module.

A prime consideration for the designer is the fact that conduction of high current at low-voltages over a long distance will produce more electrical and thermal losses, and electrical distortion than conduction over a short distance. Therefore, the closer the power regulators are to the chips themselves, the lower the amount of losses and voltage distortion that will occur.

In packaging electronic modules, one of the additional design concerns that must be taken into consideration is any detrimental by-products generated by the operation of the chips and the regulators, for example, electromagnetic interference (EMI) and thermal heating. Electromagnetic interference, produced by the power regulators, can disturb the operation of nearby electronic equipment such as telecommunications, sensitive computer circuitry, and even other power circuits. As a result, there are strict federal and international standards imposed on the level of conducted and radiated EMI permitted in commercial products. Therefore, there must be provisions for EMI shielding when designing a module package. In addition, provision must be made to dissipate the heat generated by both the chips and the regulators, and various means have been utilized to do so, such as the use of heat convection and heatsinks.

A new high power density point-of-load regulator has been developed that is of such a size as to allow the regulator to be placed on a module, close to the chips in a compact 3-Dimensional packaging configuration. Such a regulator is supplied with low current and high-voltage power and regulates this to the high current and low-voltage power needed by the chips. When a point-of-load regulator is mounted on the module itself, the power only has to be conducted a short distance to the individual chips or loads. At present, the designs for mounting these point-of-load regulators on the modules require considerable module area.

Thus, a need exists to package these new high density point-of-load regulators, by providing necessary mechanical support, heat dissipation and EMI shielding in a compact module-mounted configuration.

SUMMARY OF THE INVENTION

The present invention provides regulated power to a plurality of electronic devices mounted on a module. It includes a busbar and one or more power regulators mounted on the module, so that the busbar and power regulators receive high voltage power as an input, and produce logic level regulated power as an output to the busbar, which then is electrically coupled to the electronic devices to provide the chips with the regulated power.

This arrangement has the advantage of placing the power regulator on a busbar mounted to the module itself. Thus, the power regulators can be point-of-load regulators located near the electronic devices so as to reduce losses, the generation of heat and minimize inductive distortion.

In order to provide EMI shielding and aid in heat dissipation, a cover assembly structure is provided which includes a cold-plate that contacts the busbar, this cold-plate having at least one slot dimensioned to allow a power regulator to pass through the slot. The cold-plate can be arranged to contact both the electronic devices and the busbar so as to provide a heat dissipation conduction path for the electronic devices. In this way, the structure provides both EMI shielding and heat dissipation that is needed for both the electronic devices and the power regulators.

If a plurality of power regulators are used, there is an added advantage of redundancy of regulators, as well as allowing the placement of the individual power regulators as close as possible to the electronic devices.

Another advantage provided by the arrangement of the present invention is that the power converters are prevented from contacting the module and extend three-dimensionally from the module. This three-dimensionality allows more room on the module for the electronic devices, thereby providing higher component density packaging. The advantage is further extended when the arrangement of the present invention is provided on both sides of a module.

When the busbar is a multi-layer busbar, as in certain embodiments of the present invention, the same structure can be used to provide different logic level voltages to different electronic devices. This obviates the need for additional module area that would otherwise be taken up by different power bus lines providing the different voltage levels.

DETAILED DESCRIPTION

Figure 1:
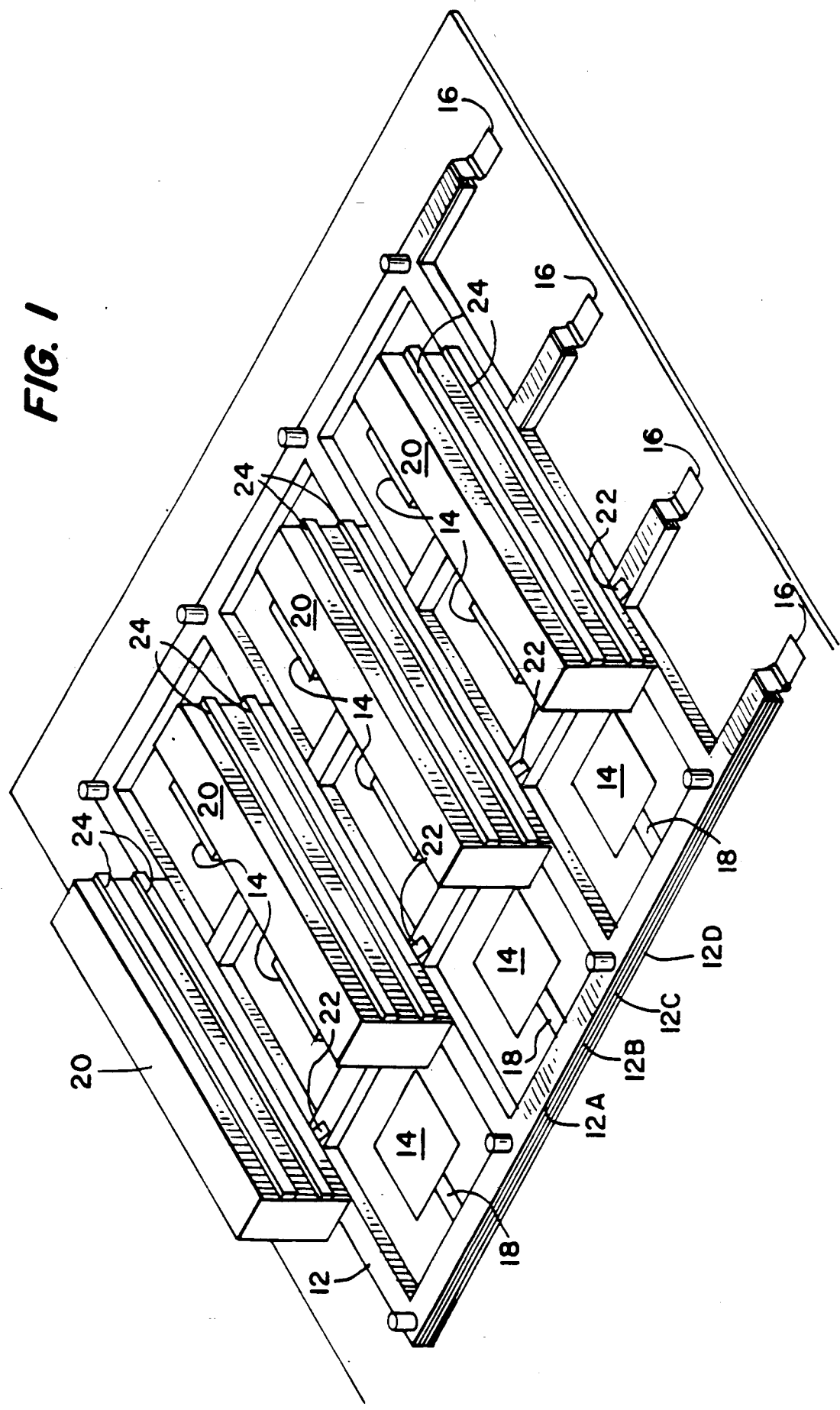
FIG. 1 is a perspective view of a three-dimensional integrated power distribution and regulation apparatus constructed in accordance with an embodiment of the present invention.

A three-dimensional integrated power distribution and regulation apparatus constructed in accordance with an embodiment of the present invention is shown in FIG. 1. A multilayer module 10 which includes internal power layers is partially shown. In this area of the module 10, a multi-layer busbar 12 is arranged on the top surface of the module 10. Although shown as being on one side of the module 10, the present invention can be provided on both sides of the module lo to fully utilize the module 10 and provide maximum density.

The multi-layer busbar 12 has a plurality of layers 12A, 12B, 12C and 12D, for example. The multiple layers 12A–C allow for different voltage levels, with respect to ground layer 12D, to be supplied to the various chips connected to the busbar 12, as will be explained in more detail later. The busbar layers may also include capacitance and control signal layers. For example, busbar layer 12B can be capacitance layer while busbar layer 12C can be a signal layer.

Mounted on the module 10 are a plurality of electronic devices such as chip packages (or chips) 14. Each of these chip packages (or chips) 14 is coupled by an input voltage-busbar interconnect 18 to at least one of the layers 12A–12D.

The input voltage to the module 10 is received through an input voltage-busbar interconnect 16, which is coupled to a voltage source (not shown). Typically, the voltage source can provide power at high DC voltage through the busbar 12. While this is relatively low-current and high voltage power, the chips 14 usually operate at a much lower voltage level, for example at logic level voltages of 5 volts and 3.3 volts DC. Therefore, there is a need to regulate and control the input power received through the input voltage-busbar interconnect 16, so that the chips 14 can be supplied with power at the proper voltage levels. For this purpose, a plurality of power regulators 20 are mounted on the multi-layer busbar 12. The power regulators 20 are coupled to the busbar 12 by a regulator-busbar interconnect 22, as well as by mechanical, thermoconductive couplings. The power regulators 20 are "point-of-load" regulators that convert low current, high voltage power to high current power, at logic level voltages. Prototypes of these point-of-load regulators 20 have been developed at the Massachusetts Institute of Technology. See the MIT Report, Sept. 1988, p. 8 for a discussion of these devices. Using the busbar 12 of the present invention, the point-of-load power regulators 20 provide on-module high density point-of-load power regulation and integrated power distribution to the various chips 14. The power regulators 20 can have a plurality of fins or heatsinks 24 to assist in the cooling of each regulator 20.

The power regulators 20 are relatively long and thin and in FIG. 1, are shown attached to the busbar 12 on edge. Such an attachment allows for packaging three-dimensional, high component density, module-level packaging. Because the regulators 20 are not mounted directly to the module 10, they do not occupy a large amount of module area, leaving this for the chips 14 themselves. Thus, more chips 14 can be mounted on the module 10 than would otherwise be the case if the power regulators 20 were shaped differently or were not mounted on edge. The more chips 14 that can be placed on a module 10, the higher the density will be for that module 10. To further increase density, smaller chips can be mounted under the busbar 12.

In operation, the input voltage-busbar interconnect 16 receives, for example, 3 amps at 40 volts DC, this input power being provided to the power regulators 20 through layer 12A, for example. The input power is regulated by the regulators 20 which produce approximately 24 amps at 5 volts or 3.3 volts DC. These logic level voltages are conducted from the regulators 20 along different layers 12B or 12C to the various chips 14, which are coupled to a particular layer via interconnect 18 depending upon which voltage level the chip 14 needs. The busbar 12 also supplies power at various voltage levels to the internal layers of the module which in turn distribute it to other lower power module components.

In addition to distributing input power to the regulators 20 and providing mechanical support for the regulators 20, the busbar 12 removes a substantial portion of the heat generated by the power regulators 20. The cooling by the busbar 12 is performed by heat conduction in the contacting bus layer 12A through both the mechanical fasteners (not shown) and the electrical power contacts connecting the regulators 20 to the busbar 12.

Besides providing mechanical support to the regulators 20, the structure of the busbar 12 also provides a rigidity to the module 10 and provides structural support for the devices. Although a "grid" structure is illustrated, different geometrical structures can be used. Although the busbar 12 is shown on only a portion of the module 10, the elements of the invention can be provided over an entire module 10, as well as to both sides of the module 10.

Figure 2:
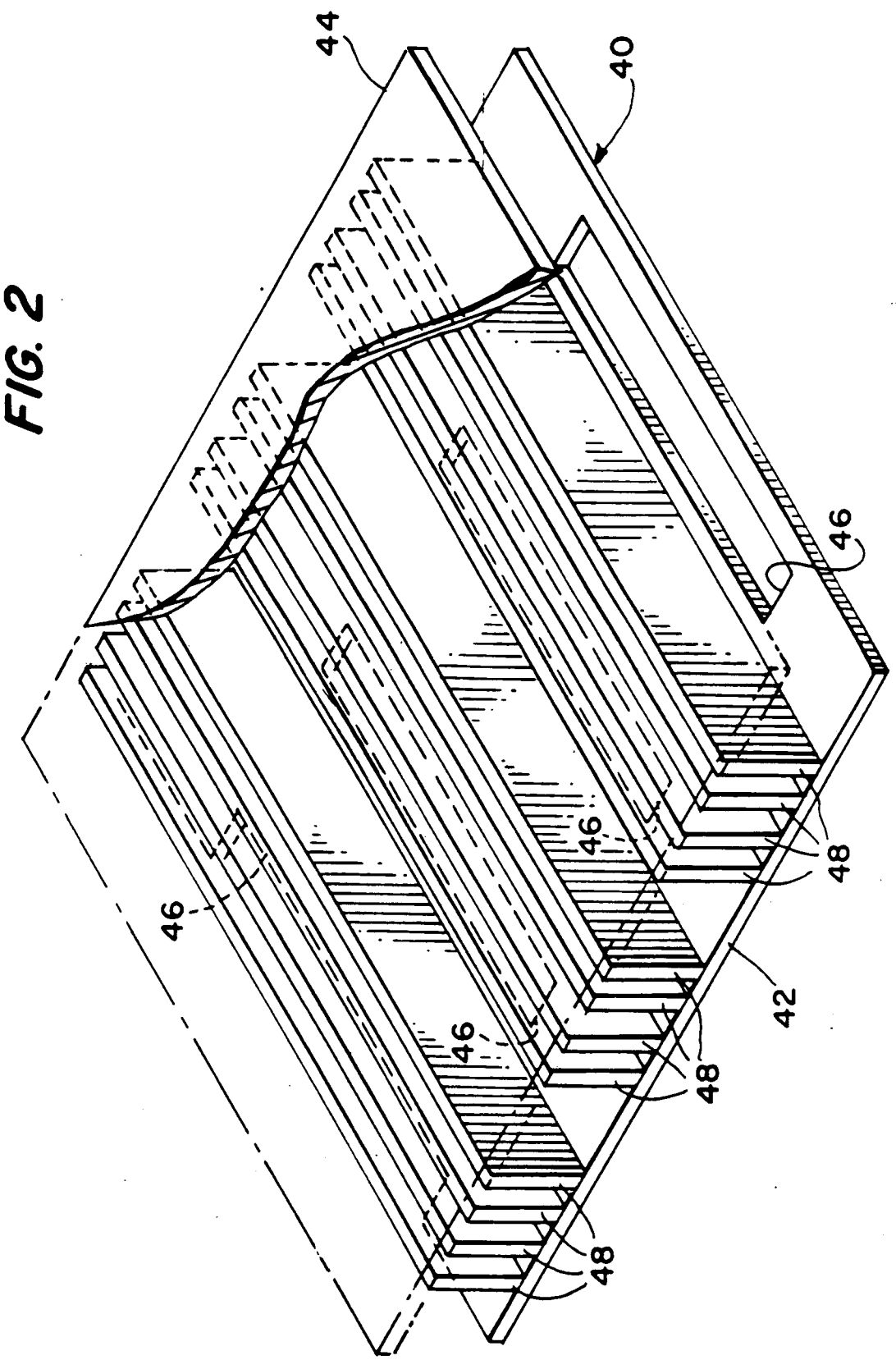
FIG. 2 shows a perspective view of a cover structure for the embodiment shown in FIG. 1.

FIG. 2 illustrates a cover assembly structure 40 which is designed to cover the busbar 12 and the regulators 20 shown in FIG. 1. The cover assembly structure 40 has a cold-plate 42 with a plurality of slots 46. These slots 46 are dimensioned so that the power regulators 20 will project through the cold-plate 42 when the cold-plate 42 is placed on top of the busbar 12.

Figure 3:
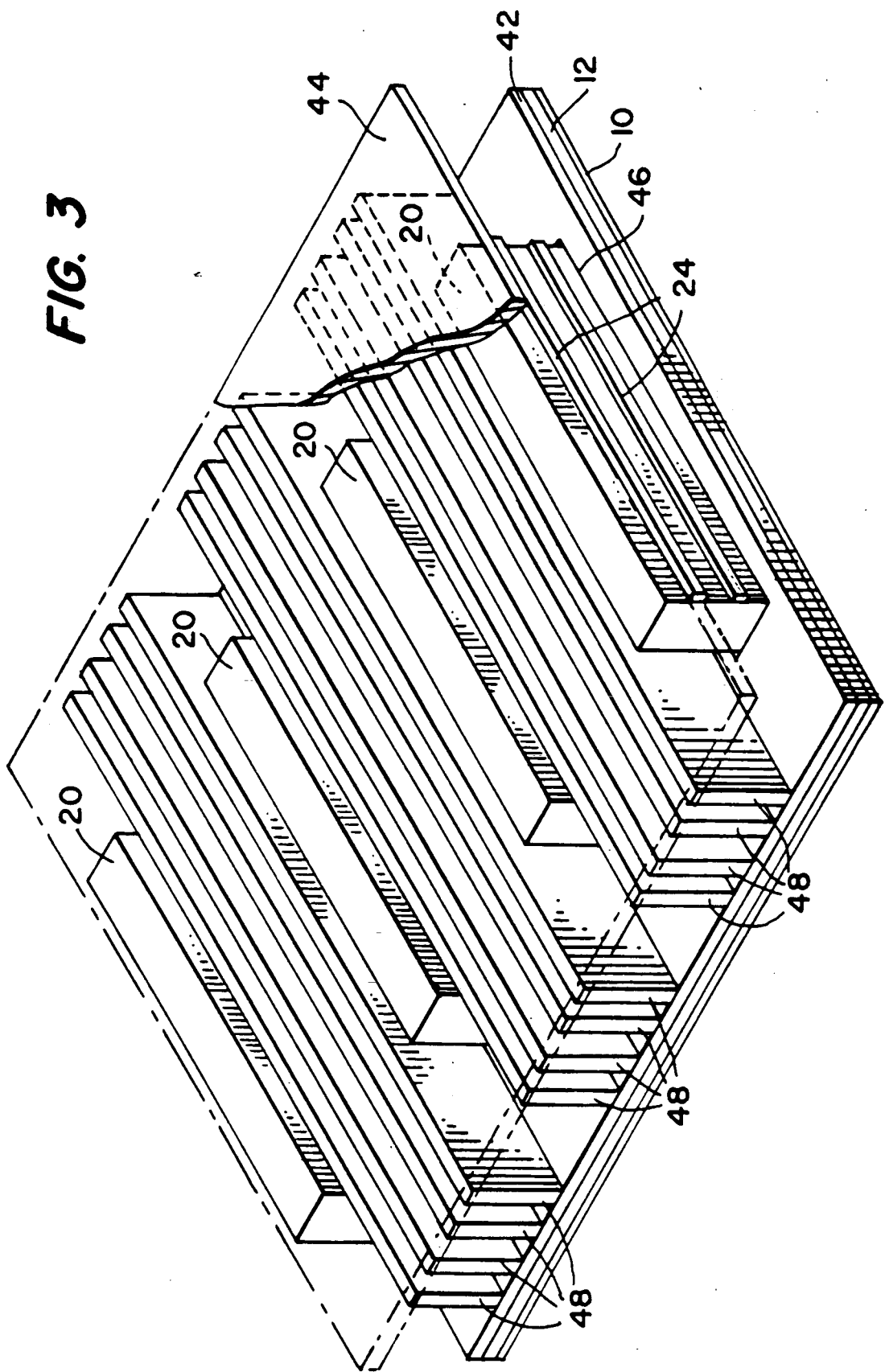
FIG. 3 shows a perspective view of the cover structure of FIG. 2 arranged on the embodiment of FIG. 1.
Figure 4:
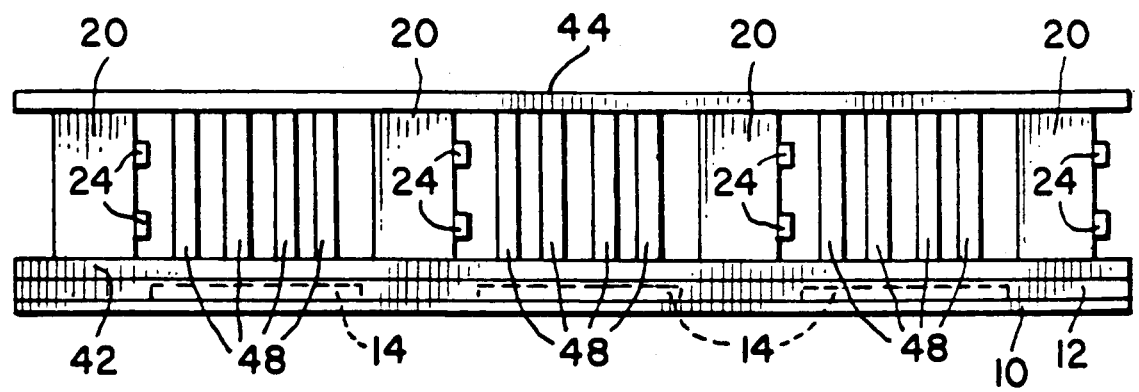
FIG. 4 shows a front view of the cover structure of FIG. 2 arranged on the embodiment of FIG. 1.

The cold-plate 42 has a plurality of fins 48 attached which are vertical to the surface of the cold-plate 42. These fins 48 extend between each of the slots 46. Finally, a top plate 44 (only seen in a partially cut-away view) is connected to the tops of the fins 48 and covers the regulators 20. An illustration of how the cover assembly structure 40 fits over the busbar 12 and regulators 20 is illustrated in FIG. 3, and a front view is presented in FIG. 4.

The finned cold-plate 42 rests on top of the busbar 12 and the chips 14. Heat is removed from the chips 14 by the cold-plate 42, which also removes heat from the regulators 20 via the heat conduction path of the busbar 12. Additional heat is removed by fluid convection directly from the power regulator heatsinks 24, since the regulators 20 extend through the slots 46 and the cold-plate 42. These regulators 20 thereby extend into a fluid convection plenum that is formed by the cold-plate 42 and the top plate 44. The convected fluid can be a gas or a liquid, for example.

The cover assembly structure 40 is electrically connected to a ground layer, 12D of the busbar 12, and provides both device-radiated electromagnetic shielding and electrostatic susceptibility protection. More specifically, the cold-plate 42 covers the chips 10 and the top plate 44 covers the power regulators 20 in such a manner as to provide electromagnetic shielding. Further, the cover assembly structure 40 suppresses the fluid-flow acoustic noise through the plenums.

Although the invention has been described and illustrated with an exemplary embodiment, the invention is not limited by this embodiment, and is to be limited only by the terms of the appended claims.

We claim:

1. An arrangement providing regulated power to a chip module, comprising:
   a busbar mounted on said module, said busbar receiving high voltage power as an input;
   at least one high density power regulator mounted on said busbar and electrically coupled to said busbar, such that the coupling length between said power regulator and said busbar is minimized, and electromagnetic interference resulting from high currents along the coupling length is also minimized, said power regulator receiving said high voltage power as an input and producing regulated power to said busbar;
   wherein said busbar is adapted to be electrically coupled to a plurality of electronic devices to provide the electronic devices with said regulated power.

2. The arrangement of claim 1, wherein said busbar is a grid having spaces said grid adapted to provide for placement of the electronic devices in said spaces.

3. The arrangement of claim 2, wherein said power regulator is mounted on said busbar in a 3-dimensional configuration which does not require module area, such that said power regulator extends outwardly from a plane of said module.

4. The arrangement of claim 1, wherein said power regulator is a point-of-load power regulator.

5. The arrangement of claim 1, wherein said power regulator produces said regulated power at a plurality of voltage levels.

6. The arrangement of claim 5, wherein said busbar is a multilayer busbar having multiple bus layer, and said power regulator is connected to said multiple bus layers so as to provide said regulated power at the plurality of voltage levels separately to said multiple bus layers.

7. An arrangement providing regulated power to a chip module, comprising:
   a busbar mounted on said module, said busbar receiving high voltage power as an input;
   at least one power regulator mounted on said busbar and electrically coupled to said busbar, said power regulator receiving said high voltage power as an input and producing regulated power to said busbar;
   wherein said busbar is adapted to be electrically coupled to a plurality of electronic devices to provide the electronic devices with said regulated power; and
   further comprising a cover assembly structure that provides EMI shielding, said cover assembly structure including a cold-plate that contacts said busbar, said cold-plate having at least one slot dimensioned to allow said power regulator to pass through said slot.

8. The arrangement of claim 7, wherein said cold-plate is adapted to contact the electronic devices so as to provide a conduction path for heat dissipation from the electronic devices.

9. The arrangement of claim 8, wherein said cover assembly structure further includes cooling fins thermoconductively coupled to said cold-plate.

10. The arrangement of claim 9, wherein said structure further includes a top plate coupled to said fins, such that at least one plenum is formed between said top plate and said cold-plate.

11. The arrangement of claim 10, wherein said cold-plate contacts said busbar such that there is a thermoconductive coupling between said cold-plate and said busbar.

12. The arrangement of claim 11, wherein said busbar has a ground layer and said cold-plate is electrically coupled to said busbar ground layer.

13. The arrangement of claim 12, wherein the power regulator includes a heatsink, and wherein said heatsink extends into said plenum.

14. The arrangement of claim 13, wherein said power regulator is thermoconductively coupled to said busbar.

15. The arrangement of claim 14, wherein said busbar, said power regulator, and said cover assembly structure are provided on each side of said module.

16. The arrangement of claim 1, wherein said busbar is arranged on said module so as to provide mechanical support and mechanical stiffness to said module.

17. The arrangement of claim 1, wherein said busbar includes couplings to internal layers of said module to provide regulated power directly to said internal layers.

18. The arrangement of claim 6, wherein said multiple bus layers include de-coupling capacitance and control signal layers.

19. The arrangement of claim 1, wherein said busbar includes multi-voltage connectors that allow direct coupling of said busbar to a high voltage power source.

20. The arrangement of claim 1, wherein said busbar and said power regulator are mounted on three-dimensionally on said module, said power regulator being mounted on said busbar such that said power regulator extends away from a plane of said module, thereby reserving module surface area for high density device packaging.

21. The arrangement of claim 7, wherein said power regulator produces said regulated power at a plurality of voltage levels.

22. The arrangement of claim 21, wherein said busbar is a multilayer busbar having multiple bus layers, and said power regulator is connected to said multiple bus layers so as to provide said regulated power at the plurality of voltage levels separately to said multiple bus layers.

23. The arrangement of claim 7, wherein said busbar is a grid having spaces, said grid adapted to provide for placement of the electronic devices in said spaces.

24. The arrangement of claim 23, wherein said power regulator is mounted on said busbar in a 3-dimensional configuration which des not require module area, such that said power regulator extends outwardly from a plane of said module.

25. The arrangement of claim 7, wherein said power regulator is a point-of-load regulator.

26. An arrangement providing regulated power to a chip module, comprising:
   a busbar mounted on said module, said busbar receiving high voltage power as an input;
   at least one power regulator mounted on said busbar and electrically coupled to said busbar, said power regulator receiving said high voltage power as an input and producing said regulated power to said busbar;
   wherein said busbar is adapted to be electrically coupled to a plurality of electronic devices to provide the electronic devices with said regulated power; and further comprising a cover assembly structure that provides EMI shielding, said cover assembly structure including a cold-plate that contacts said busbar.

27. The arrangement of claim 26, wherein said cold-plate is adapted to contact the electronic devices so as to provide a conduction path for heat dissipation from the electronic devices.

28. The arrangement of claim 28, wherein said cover assembly structure further includes cooling fins thermoconductively coupled to said cold-plate.

29. The arrangement of claim 28, wherein said cover assembly structure further includes a top plate coupled to said cooling fins, such that at least one plenum is formed between said top plate and said cold-plate.

30. The arrangement of claim 29, wherein said cold-plate contacts said busbar such that there is a thermoconductive coupling between said cold-plate and said busbar.

31. The arrangement of claim 30, wherein said busbar has a ground layer and said col-plate is electrically coupled to said busbar ground layer.

32. The arrangement of claim 31, wherein the power regulator includes a heatsink, and wherein said heatsink extends into said plenum.

33. The arrangement of claim 32, wherein said power regulator is thermoconductively coupled to said busbar.

34. The arrangement of claim 33, wherein said busbar, said power regulator and said cover assembly structure are provided on each side of said module.

35. The arrangement of claim 26, wherein said power regulator produces said regulated power at a plurality of voltage levels.

36. The arrangement of claim 35, wherein said busbar is a multilayer busbar having multiple bus layers, and said power regulator is connected to said multiple bus layers so as to provide said regulated power at the plurality of voltage levels separately to said multiple bus layers.

37. The arrangement of claim 26, wherein said busbar is a grid having spaces in which the electronic devices are arranged.

38. The arrangement of claim 37, wherein said power regulator is mounted on said busbar in a 3-dimensional configuration which does not require module area, such that said power regulator extends outwardly from a plane of said module.

39. The arrangement of claim 26, wherein said power regulator is a point-of-load regulator.

* * * * *